(12) United States Patent
Span (10) Patent No.: US 6,762,484 B2
(45) Date of Patent: Jul. 13, 2004

(54) THERMOELECTRIC ELEMENT (76) Inventor: Gerhard Span, Rettlsteinerweg 50b, Wattens (AT), A-6112

( * ) Notice: Subject to any disclaimer, the term of this patent is extended or adjusted under 35 U.S.C. 154(b) by 165 days.

(21) Appl. No.: 10/280,065

(22) Filed: Oct. 25, 2002

(65) Prior Publication Data

US 2003/0042497 A1 Mar. 6, 2003

Related U.S. Application Data (63) Continuation of application No. PCT/AT01/00123, filed on Apr. 25, 2001.

(51) Int. Cl.[7] ............... H01L 29/06; H01L 31/0352; H01L 23/38; H01L 27/16; H01L 35/00
(52) U.S. Cl. ..................... 257/653; 257/930
(58) Field of Search ............... 257/653, 655, 257/930

(56) References Cited

U.S. PATENT DOCUMENTS

| | | | |
|---|---|---|---|
| 2,981,775 A | | 4/1961 | Bachman |
| 3,564,860 A | | 2/1971 | Reich et al. |
| RE30,652 E | * | 6/1981 | Germano et al. ........... 136/203 |
| 4,850,713 A | | 7/1989 | Thery et al. |
| 5,009,717 A | | 4/1991 | Komabayashi et al. |
| 5,376,184 A | | 12/1994 | Aspden |
| 5,644,184 A | | 7/1997 | Kucherov |
| 5,834,828 A | * | 11/1998 | Horn et al. ................. 257/618 |
| 6,300,150 B1 | * | 10/2001 | Venkatasubramanian ..... 438/27 |

FOREIGN PATENT DOCUMENTS

| | | |
|---|---|---|
| EP | 0 124 128 | 11/1984 |
| EP | 0 369 670 | 5/1990 |
| EP | 0 969 526 | 1/2000 |
| GB | 2 283 361 | 5/1995 |
| JP | 57-1276 | 1/1982 |
| JP | 57-169283 | 10/1982 |
| JP | 59-980 | 1/1984 |
| JP | 1-208876 | 8/1989 |
| JP | 4-63481 | 2/1992 |
| JP | 07038158 | 2/1995 |
| JP | 10022351 | 1/1998 |
| JP | 10022530 | 1/1998 |
| JP | 10144969 | 5/1998 |
| JP | 11195817 | 7/1999 |

* cited by examiner

*Primary Examiner*—Ngân V. Ngô
(74) *Attorney, Agent, or Firm*—Wenderoth, Lind & Ponack L.L.P.

(57) ABSTRACT

The invention relates to a thermoelectric element comprising at least one n-type layer (1) and at least one p-type layer (2) of one or more doped semiconductors, whereby the n-type layer(s) (2) are arranged to form at least one pn-type junction (3). At least one n-type layer (1) and at least one p-type (2) are contacted in an electrically selective manner, and a temperature gradient ($T_1$, $T_2$) is applied or tapped parallel (x-direction) to the boundary layer (3) between the at least one n-type layer (1) and p-type layer (2). At least one pn-type junction is formed essentially along the entire, preferably longest, extension of the n-type layer(s) (1) and the p-type layer(s) (2) and, thus, essentially along the entire boundary layer (3) thereof.

22 Claims, 15 Drawing Sheets

PRIOR ART

THERMOELECTRIC ELEMENT

The present application is a continuation of PCT/AT01/00123, filed Apr. 25, 2001.

BACKGROUND OF THE INVENTION

The invention relates to a thermoelectric element with at least one n-layer and at least one p-layer of one or more doped semiconductors, wherein the n-layer(s) and the p-layer(s) are disposed so that at least one pn-junction is formed. At least one n-layer and at least one p-layer are electrically selectively contacted, and a temperature gradient is established or obtained parallel (x-direction) to the boundary layer between at least one − and p-layer.

Figure 1:
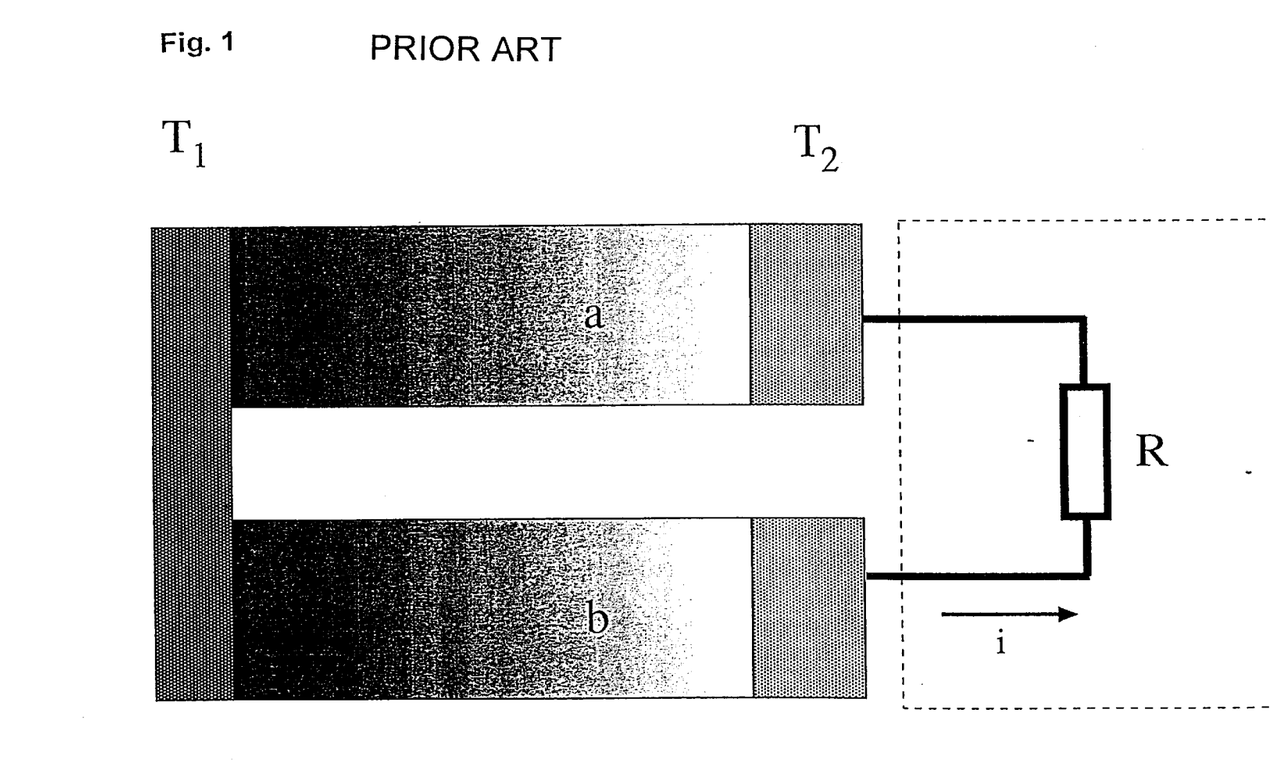
FIG. 1 is a diagrammatic sketch of a thermocouple according to the state of the art.

The thermoelectric effect has already been known for more than 100 years. There is a broad spectrum of materials which can be used for the direct conversion of a temperature gradient into electric current. The technical conversion of this effect has hitherto always been based on a common basic structure (FIG. 1). Two different metals (a, b) or two differently (n- and p-) doped semiconductors are connected at one end, normally the hot end (temperature $T_1$). At the other, normally cold end (temperature $T_2$), the current can then be measured (resistance R as symbolic load). Such thermoelectric elements are known from, for example, the specifications EP 0 969 526 A1, JP 11195817 A, JP 10144969 A, JP 10022531 A, JP 10022530 A, JP 57-1276 (A), JP 07038158 A, JP 59-980 (A), JP 57-169283 (A), JP 4-63481 (A) and U.S. Pat. No. 5,009,717. In some cases, a conductive layer is incorporated as a contact surface between the − and p-layer in the region of the p-n junction. A common feature of all these thermoelectric elements is that the p-n junction is formed only in a small region between the − and p-layers whereas the larger region between the − and p-layer is formed as an air gap or as an isolating layer (JP-63481 (A) and U.S. Pat. No. 5,009,717).

Figure 2:
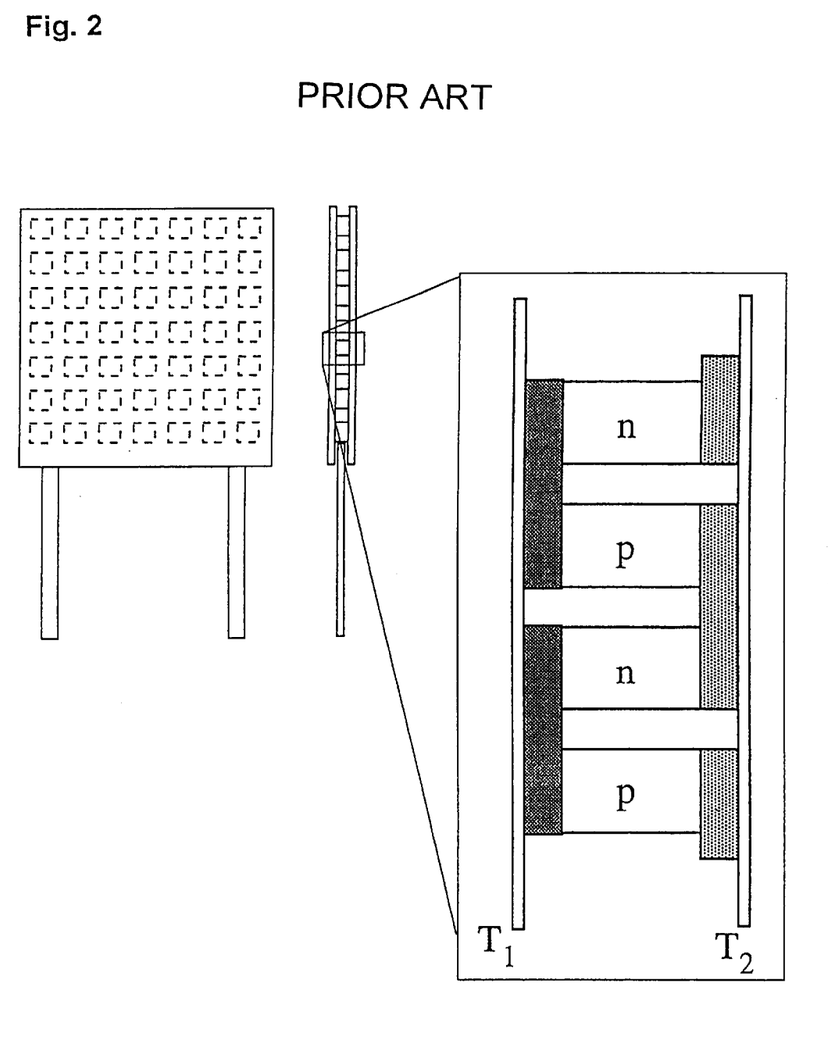
FIG. 2 is a thermoelectric module according to the state of the art.

To obtain the most effective possible conversion of the temperature gradient into electric current, the thermoelectric elements are assembled to form a module, in such a manner that the individual elements are electrically switched in series, but thermally parallel. These modules can in turn be combined to form larger units (FIG. 2).

The choice of materials used is made according to the point of view of the maximum possible degree of efficiency in the targeted temperature range. The degree of efficiency is generally characterized by the figure of merit $Z=S^2/\rho k$ (S . . . Seebeck coefficient or absolute differential thermoelectric force, $\rho$ . . . specific resistance, k . . . heat conductivity). A high degree of efficiency is achieved in a material with a high Seebeck coefficient with simultaneous low specific resistance and low heat conductivity.

The prior art has some disadvantages. The properties of a material which are important for thermoelectricity (S . . . Seebeck coefficient, $\rho$ . . . specific resistance, k . . . heat conductivity) can only be influenced independently of one another to a very small extent. This connection limits the degrees of efficiency currently achievable to approximately 10–20%. In addition, the development of the temperature gradient in the state of the art has scarcely any influence on the degree of efficiency because, in conventional thermoelectric elements, only the total difference in the temperature between the hot and cold side plays a role, due to the linear connection between thermoelectric force and temperature difference. Furthermore, attempts to use alternative concepts such as, for example, diodes (pn-junctions), so that one side of the pn-junction is warmer than the other side, do show an increase in the degree of efficiency, but the original concept has not been essentially extended.

SUMMARY OF THE INVENTION

The object of the invention is therefore to create an improved thermoelectric element. According to the invention, this object is achieved in that at least one pn-junction is essentially formed along the total, preferably longest extent of the n-layer(s) and p-layer(s), and thus essentially along the whole boundary layer. A central, fundamentally novel idea is to use at least one pn-junction, with the temperature gradient developing along the pn-junction which has a corresponding longitudinal extent.

In the state of the art, the pn-junction is formed only in a small contact region with a constant temperature, mostly on the high temperature side of the thermoelectric element. It thus serves only to improve the electric contact between the − and the p-doped parts (layers). In contrast to this, according to the present invention, at least one pn-junction is essentially formed over the whole extent of the − and p-layers, with a temperature gradient being established along the pn-junction boundary layer. This gives rise to a temperature difference along this elongated pn-junction between two ends of a player package, which leads to the degree of efficiency of the thermoelectric element according to the present invention being distinctly higher than in the state of the art, which has no temperature gradient along and within the p-n junction. The more precise method of operation is based on the different type of formation of potential modulations in a pn-junction at different temperatures, as explained below with reference to the description of the figures.

What is important for the function principle of this novel type of thermoelectric element is the selective contacting of − and p-layer. This can preferably be carried out either by alloying of the contacts and the pn-junctions connected to them, or by direct contact of the individual layers.

BRIEF DESCRIPTION OF THE DRAWINGS

Further advantages and details of the invention are explained in more detail with reference to the following description of the figures, in which.

DETAILED DESCRIPTION OF THE INVENTION

Figure 3A:
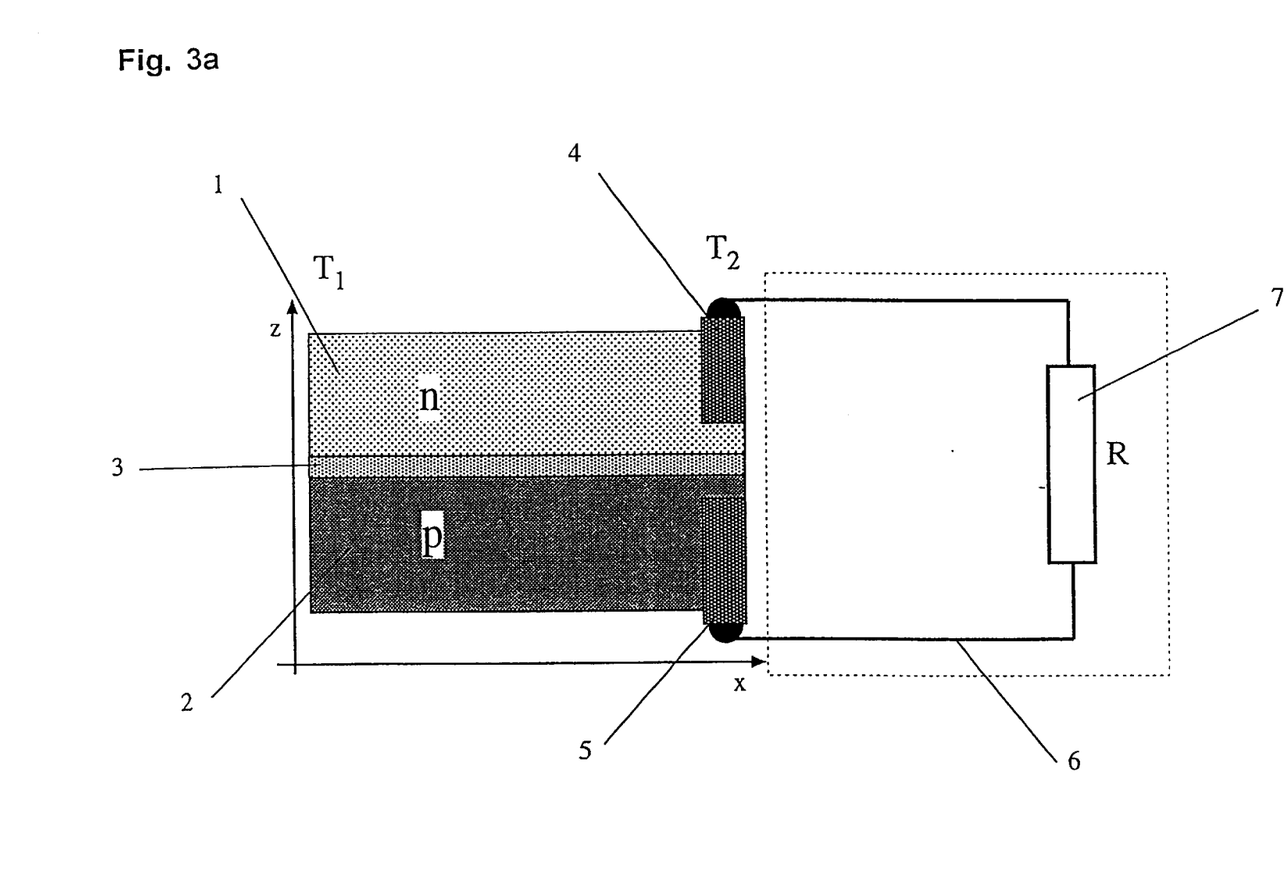
FIG. 3a is a diagrammatic sketch of an embodiment of a thermoelectric element according to the invention.

The basic construction of a thermoelectric element according to the invention is shown in FIG. 3A. An n-layer 1 and a p-layer 2 form a pn-junction 3. The n-layer 1 and the p-layer 2 are selectively contacted via contacts 4 and 5, which lead via a conductor 6 to the resistive load 7 (R). The temperature gradient ($T_1$ designates the higher temperature, $T_2$ designates the lower temperature) is established parallel to the pn-junction 3 (x-direction).

Figure 3B:
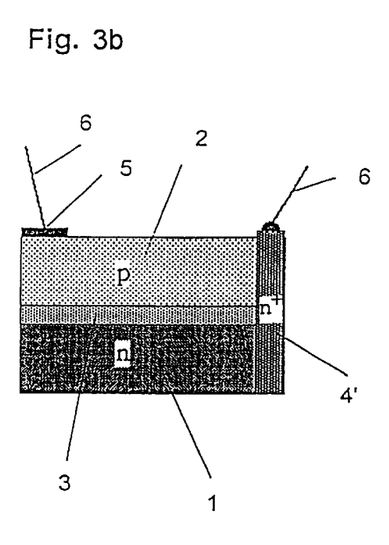
FIGS. 3b and 3c are sectional views of further embodiments with different selective contacting of the n-layer/p-layer.
Figure 3C:
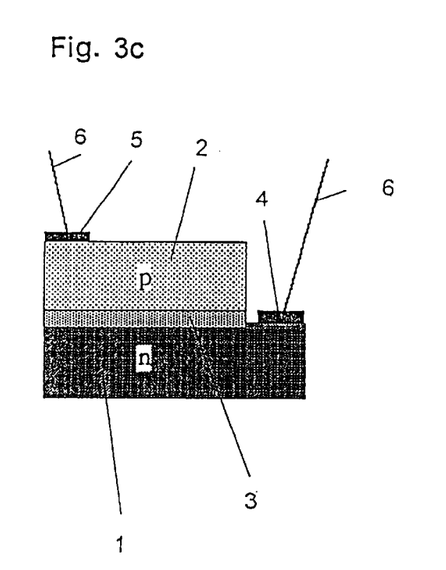

FIGS. 3b and 3c show embodiments of the selective contacting of the n-layer 1 or the p-layer 2. The surface thicknesses, in comparison with the extent of the contact in the x-direction, are represented distinctly larger (approx. factor 100–1000). In the embodiment represented in FIG. 3b, the p-layer 2 is contacted directly via a superficially evaporated gold contact 5 (and gold wire 6). For the contacting of the n-layer, an alloyed contact 4' is used. For PbTe, indium can, for example, be used as the alloyed contact. The indium is applied superficially and diffused into the layer package by heating. The PbTe-indium alloy is of type $n^+$(highly doped). An ohmic contact is thus formed to the n-layer 1, and a pn-junction to the p-layer 2.

In the embodiment represented in FIG. 3c, the contacting of the n-layer 1 and p-layer 2 is carried out directly, and this is possible by, for example, selective etching of the top layer.

The particular point of the arrangement lies in the fact that the non-linear thermal properties of pn-junctions are exploited. The temperature influences both the Fermi energy and also (especially) the energy distribution of the charge carrier. In a pn-junction, this results in a change in the potential modulation. Potential modulation here describes modulation of the potential for charge carriers in semiconductor structures, such as via a pn-junction. Thus, an electron has a higher energy potential in the p-layer than in the n-layer (and vice-versa for holes), and the difference between these two potentials is the potential modulation. Because an equilibrium value for potential modulation now exists for each temperature, there is a change in the potential modulation when the temperature changes.

Via a temperature gradient parallel to the boundary layer between the – and p-layer, a lateral potential gradient is therefore formed in the x-direction, resulting in an ambipolar charge carrier diffusion and, hence, to transient currents. Ambipolar charge carrier diffusion here means rectified diffusion of opposite charge carriers in the rectified concentration gradient, as described with reference to FIG. 7. Via the selective contacts (separate contacts for – and p-layer, not in conductive connection with one another), this internal transient current can be conducted outwards. This procedure is briefly described in the following sections.

The narrow-band semiconductor PbTe (lead telluride) is to be considered as an example. The change in the potential modulation and, thus, the maximum theoretically useful voltage of the thermoelectric element is approximately 20 mV/100 K=$2\times10^{-4}$V/K (volts/degrees Kelvin) and is therefore higher than the order of magnitude of the Seebeck coefficient of approx. $1\times10^{-6}$V/K. By constructing modules from series-connected elements, higher voltages can be achieved.

Figure 4:
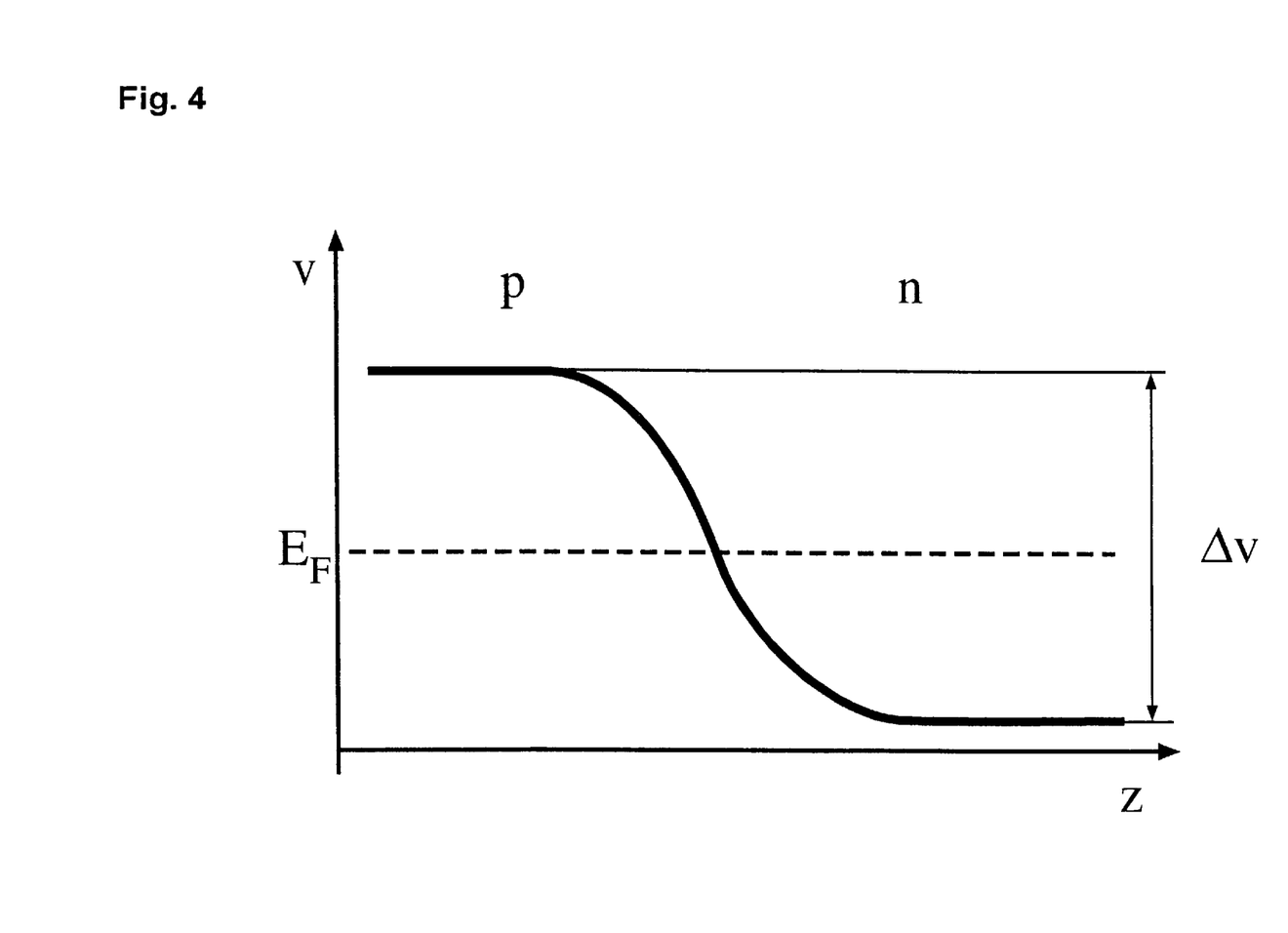
FIG. 4 is a graph of the potential v in the region of the pn-junction as a function of the space coordinates z perpendicular to the pn-junction.
Figure 5:
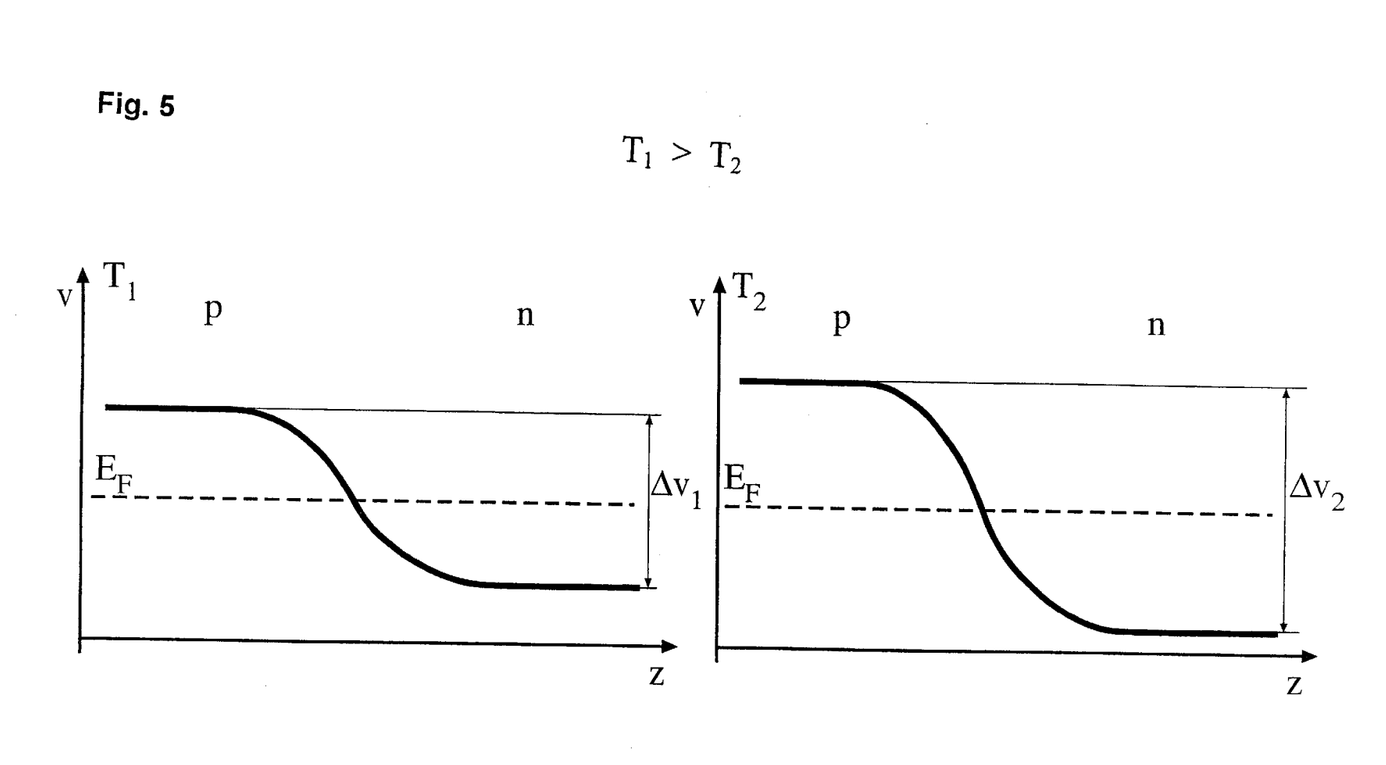
FIG. 5 are two graphs similar to FIG. 4, but at different temperatures, $T_1$ and $T_2$.

In thermal equilibrium, the charge carriers (n and p) are distributed so that joint Fermi energy $E_1$ is formed (FIG. 4). The condition of the Fermi energy is a function of temperature and has an effect on potential modulation $\Delta v$, so that potential modulation also becomes a function of temperature. For two different temperatures $T_1$ and $T_2$, with $T_1$ being higher than $T_2$, the situation as represented in FIG. 5 results. The pn-junction with the higher temperature $T_1$ has a lower potential modulation $\Delta v_1$.

Figure 6:
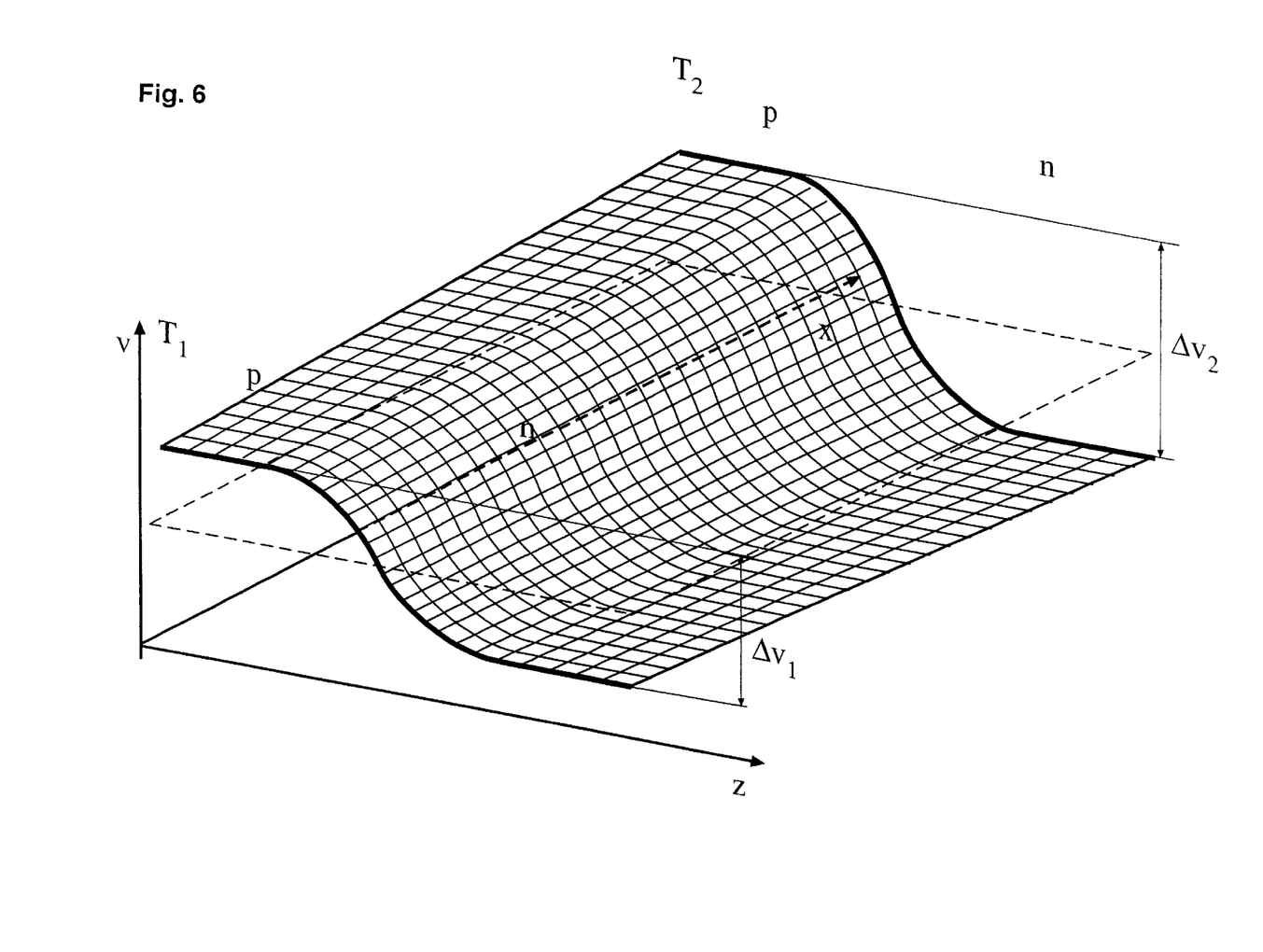
FIG. 6 is a schematic three-dimensional representation of the formation of the potential gradient in the − and p-layer.

If, in a layer package comprising at least one – and p-layer, a temperature gradient (T1>T2) according to the invention is parallel to the boundary layer between – and p-layer in the x-direction, regions with different temperatures are electrically in contact. As the potential modulation decreases as the temperature increases, this has the consequence that adjacent points along the x-axis are at different potentials. FIG. 6 shows this schematically in a 3D-representation.

Figure 7:
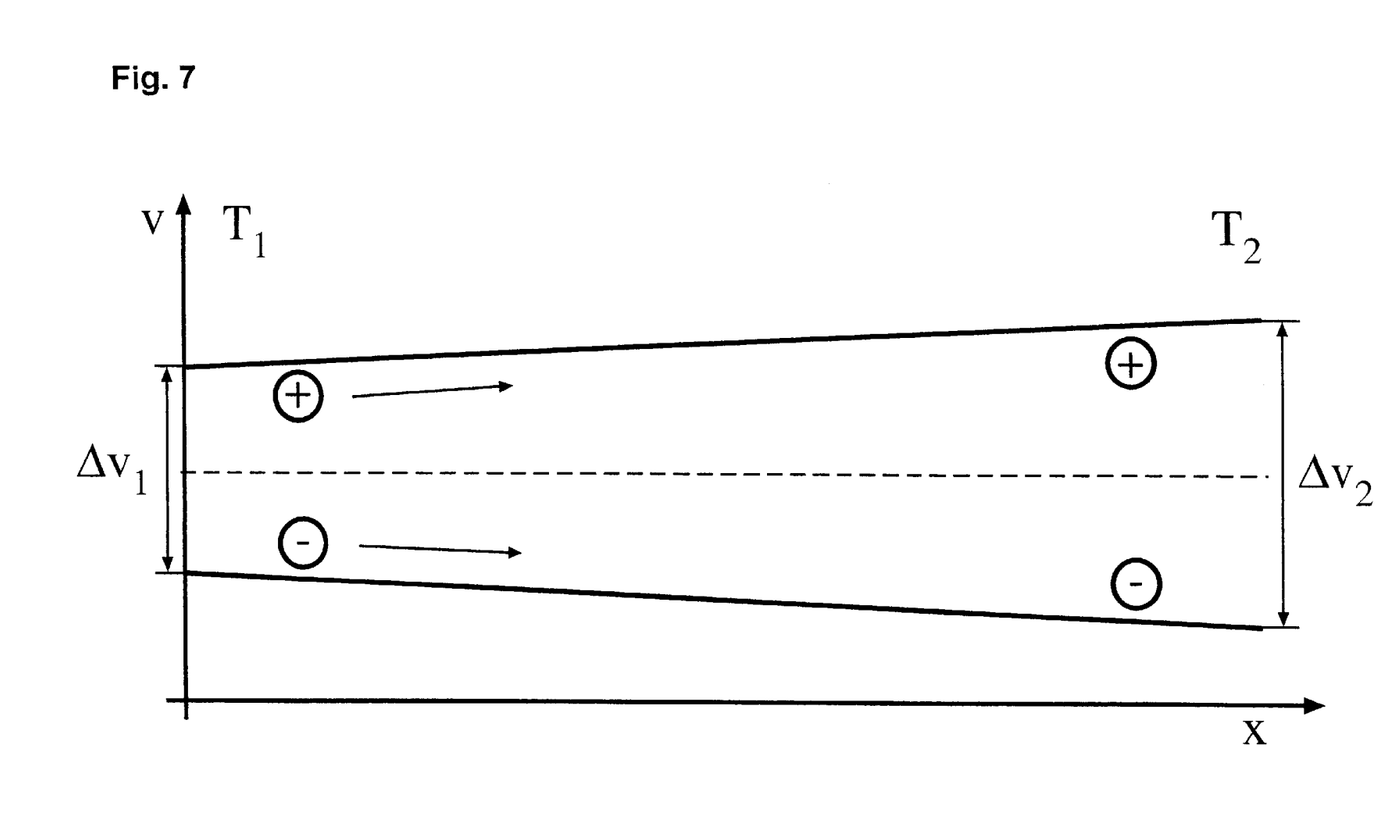
FIG. 7 is a schematic representation of the formation of an ambipolar diffusion.

As long as no current is flowing, the Fermi energy E1 is horizontal in a z-V diagram (FIG. 4). Thus, a potential gradient is formed in the x-direction in each case both in the p- and also in the n-layer. The potential gradients are in opposite directions in the two layers, i.e. the charge carriers in the two layers (electrons in the – and holes in the p-layer) are driven in the same direction. This charge carrier transport is known as ambipolar diffusion. FIG. 7 is a side view of FIG. 6, to make this behavior clear (holes are designated + and electrons –).

Figure 8:
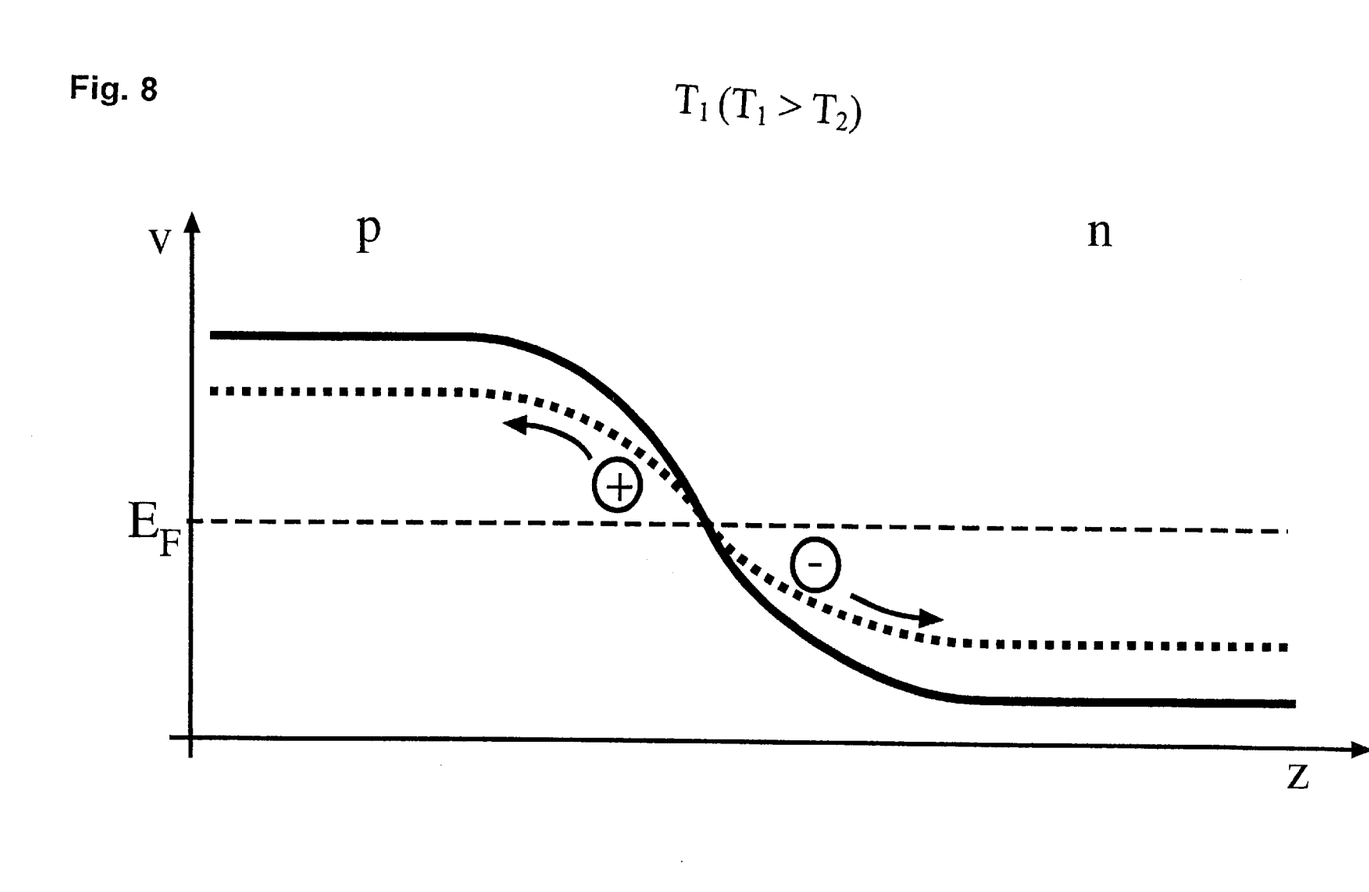
FIG. 8 is a diagram of the generation of electron-hole pairs.

The ambipolar diffusion now has the consequence that in the region of the high temperature T1 of the pb-layer package, charge carriers are removed, resulting in a charge carrier deficit, the screening effect on the potential being reduced, and the potential modulation increasing. This has the consequence that the local pn-junction is no longer in thermal equilibrium, and the thermal generation of electron-hole pairs outweighs the recombination (see arrows in FIG. 8).

Figure 9:
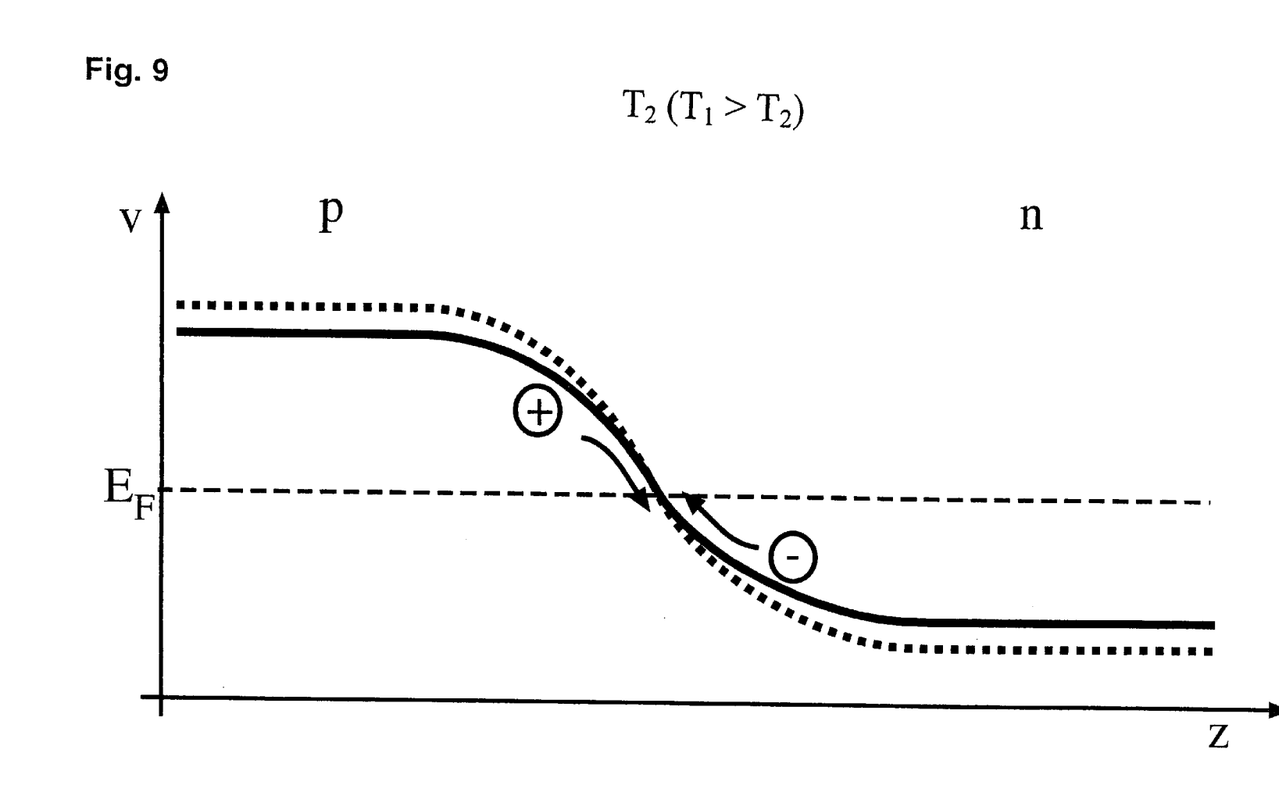
FIG. 9 is a graph illustrating the recombination of electron-hole pairs by reduction of the potential modulation.

In the region of the low temperature $T_2$, a charge carrier surplus occurs. This surplus in turn increases the screening effect on the local potential and, thus, results in a reduction of the local potential modulation in comparison with the thermal equilibrium. This now brings about a strengthened recombination of the electron-hole pairs (see arrows in FIG. 9).

The final result is that, in a layer package with at least one pn-junction, a circular current flows as long as one region of the layer package is warmer than the rest. In other words, there is a temperature gradient parallel to the boundary layer. This circular current transports heat.

Due to the temperature gradient parallel to the boundary layer between the – and p-layer, a generation of electron-hole pairs thus results in the region of the high temperature, and a recombination of these pairs results in the region of the low temperature, with the resultant transient currents. As the potential modulation between – and p-layer changes in comparison to the thermal equilibrium, a voltage can be measured between the – and p-layer.

As the potential modulation between the – and p-layer changes and generation- and recombination-currents flow, contacts must be used which respectively selectively contact only the n-layer, and other contacts must be used which respectively selectively contact only the p-layer, in order to be able to conduct the currents to the outside. The selectivity can either be ensured by alloy formation (FIG. 3b) and formation of pn-junctions or by direct contacting (FIG. 3a, FIG. 3c) of the individual layers.

The principle of the pn-junctions is generally applicable, so that all materials which form a pn-junction can be of interest for thermoelectricity.

The properties of a material which are important for thermoelectricity (S . . . Seebeck coefficient , ρ . . . specific resistance, k . . . heat conductivity) can only to a very small extent be influenced independently of one another. With the new principle put forward here, the lateral changes in the important physical parameters in the x-direction have an influence on the whole element, thus opening up an abundance of new possibilities for increasing the degree of efficiency. These physical parameters include the composition of the material used, the doping, the layer thicknesses, width, etc.

Figure 10:
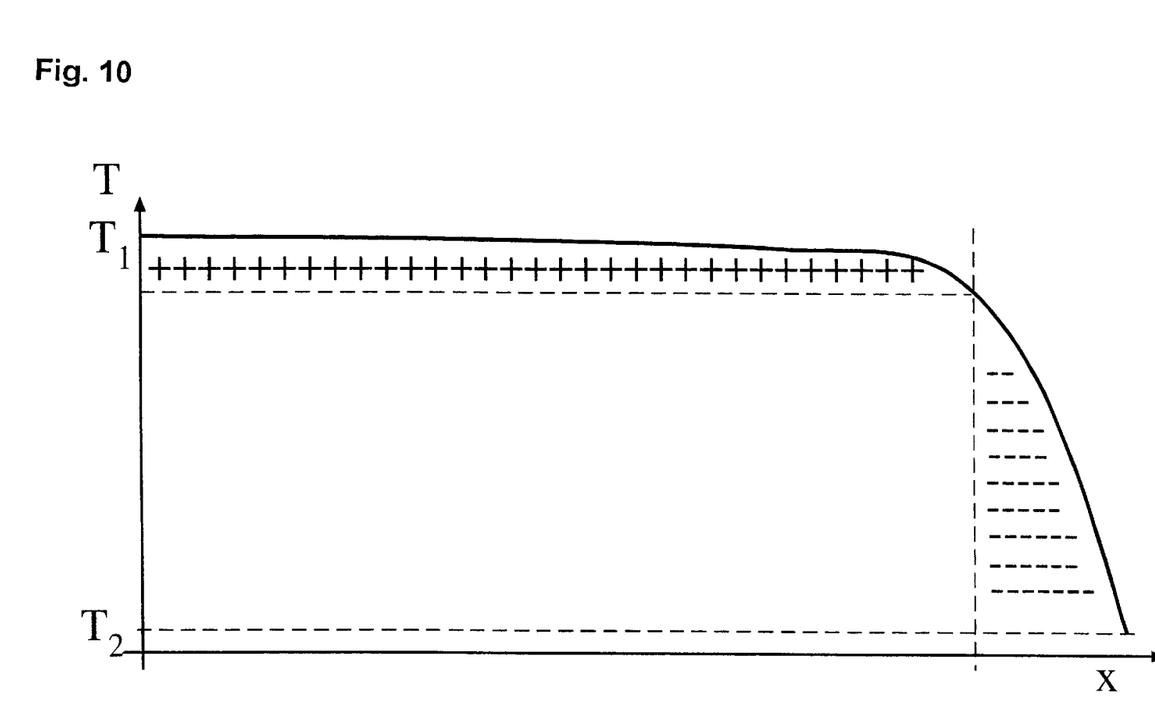
FIG. 10 ks a graph illustrating the favorable development of the temperature gradient via the thermoelectric element.

The nature of the temperature gradient has an influence on the degree of efficiency. In other words, by skillful selection of the temperature distribution, the degree of efficiency can be increased. If, as shown in FIG. 10, the high temperature region is very large in comparison with the low temperature region (flat gradient with high temperatures, steep gradient with low temperatures), this results in a larger region with generation of electron-hole pairs (designated with a +) and a small region with increased recombination (designated with a –). In other words, the circular currents strengthen, and the degree of efficiency of the whole system increases.

Figure 11:
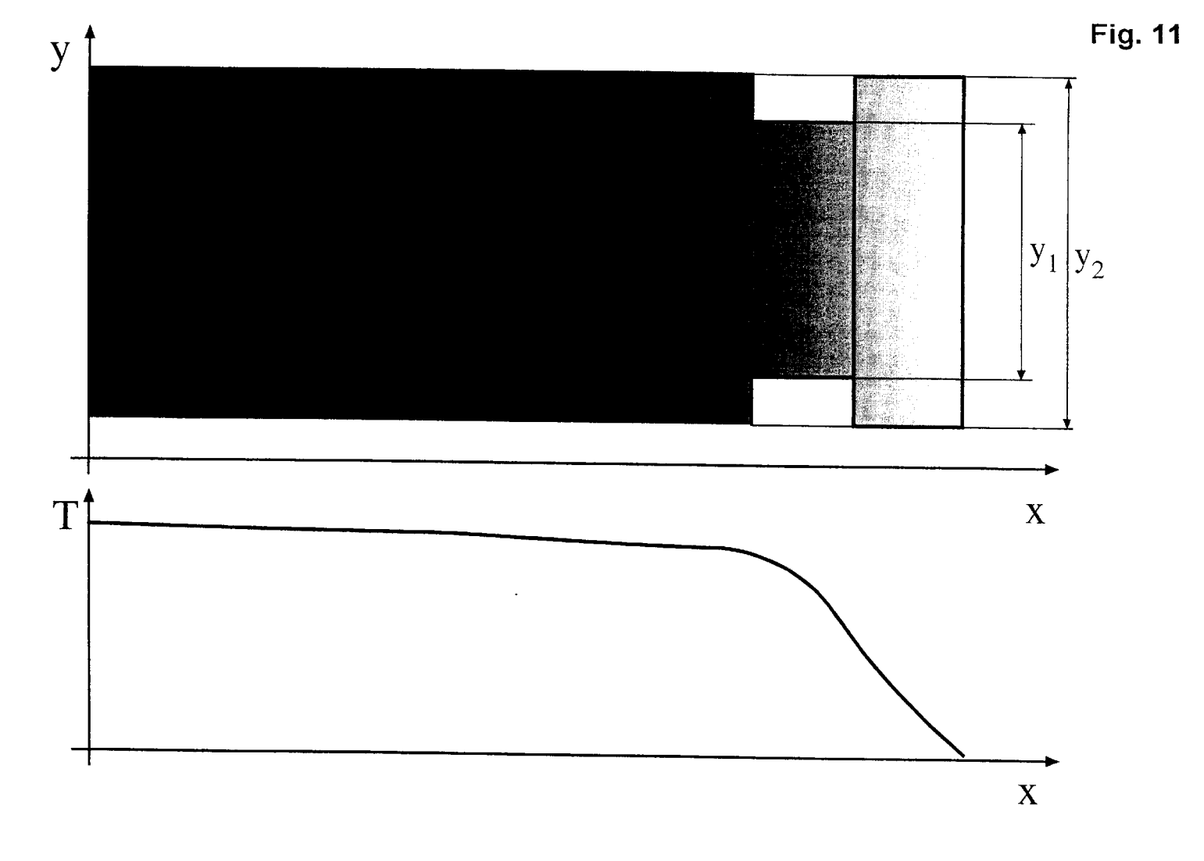
FIG. 11 is a top view of a thermoelectric element with a width variation, and a graph of the temperature gradient thereby achieved.

Such a gradient can be achieved by various measures. One possibility is a variation in the composition of the material, so that at the hot end a material with higher heat conductivity is used than at the cold end. Also a change in width can bring about the desired temperature gradient, as shown schematically in FIG. 11.

A consumption of current at the cold end brings about a strengthened recombination and the internal potential gradients in the x-direction are increased, which strengthens the ambipolar diffusion. This means that the ambipolar diffusion of the charge carriers is further strengthened by a consumption of current, which means that, due to consumption of current, the degree of efficiency is increased.

For the invention, fundamentally the same physical parameters are significant as in the conventional concept. However, with the concept put forward here, the interdependence of the parameters can be influenced, as the lateral change in parameters has an influence on the degree of efficiency of the total structure. In addition, this concept opens up an abundance of new candidates for good thermoelectric materials.

There is scarcely any restriction on the selection of materials, as all electrically conductive substances exhibit a thermoelectric (Seebeck) effect. However, the materials differ in degree of efficiency and also in the degree of efficiency as a function of temperature. Thus, the materials used must be selected on the basis of the desired temperature range.

Compound semiconductors are, due to their low heat conductivity, the preferred materials for thermoelectric elements. Some examples of good thermoelectric materials are: $Bi_2Te_3$, PbTe, SiGe. Also, some ternary and quaternary compounds show high degrees of efficiency. Research is currently being carried out to find these new materials.

Elementary semiconductors (such as Si), due to heat having conductivity that is too good to, have a poor degree of efficiency in the conventional type of construction and are, therefore, not used as thermoelectric materials. With the idea put forward here, however, these materials can also achieve a high degree of efficiency, because the temperature distribution, in addition to the electric and thermal conductivity ratio, also plays a role.

High to very high doping is necessary to keep the specific resistance as low as possible. The doping values are, of course, dependent on the material. For example, in the case of PbTe, doping values of $10^{18}$ $cm^{-3}$ and higher are necessary.

The type of contact is also of great importance for the new concept. As the internal transient currents are to be branched off, the layers must be selectively contacted. This selective contacting can be carried out either via a direct and exclusive electric connection to the desired layer, or by alloying of the contacts.

Not only is the absolute temperature difference important, but the temperature gradient also plays a large role. By skillful selection of the temperature distribution, with a flat gradient in the high temperature region and a steep gradient towards the low-temperature end, the degree of efficiency can be increased.

The potential gradient being built up internally can, for example, be increased by a change in the potential modulation between the – and p-layer due to a doping gradient. Also, the heat conductivity can be influenced laterally (in an x-direction) by changes in thicknesses or variations in composition and, thus, the desired temperature gradient can be achieved.

The internal potential gradient is further strengthened by the removal of charge carriers. This results in a positive feedback, and the degree of efficiency of energy conversion is increased.

Figure 12:
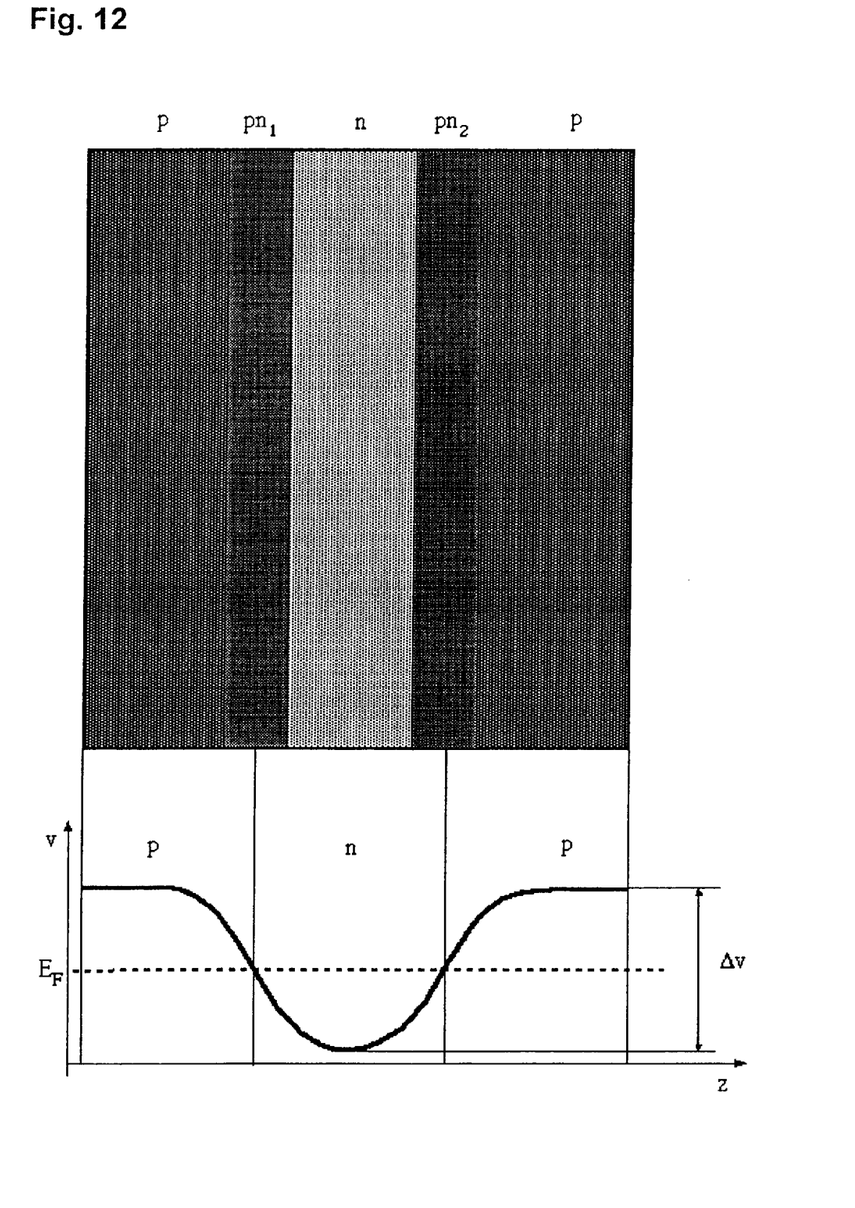
FIG. 12 is a schematic view of an embodiment with two pn-junctions.

At least one pn-junction must be present. However, it is also possible for more than one junction to be used, with – and p-layers always alternating. FIG. 12 shows an embodiment with layer sequence p-n-p and two pn-junctions, $pn_1$ and $pn_2$.

The elements according to the invention put forward here can be combined to produce modules, in order to achieve an electric series- and a thermal parallel connection. A possible type of construction of such a module is shown in FIG. 13.

Figure 13:
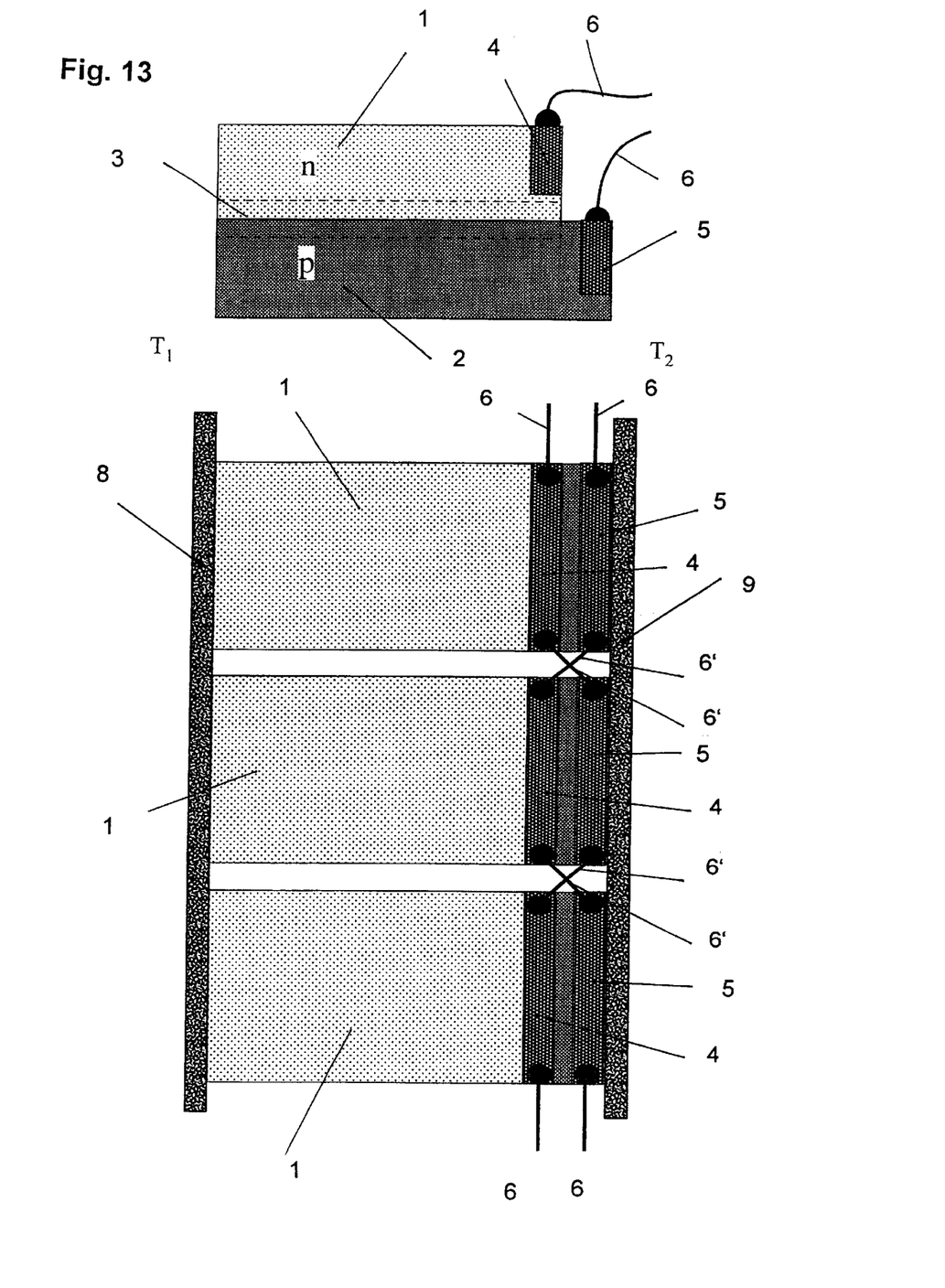
FIG. 13 is a view of the construction of a thermoelectric module from several thermoelectric elements according to the invention.

In the embodiment represented in FIG. 13, three thermoelectric individual elements with a layer sequence as in FIG. 13 are disposed thermally parallel at the top between two boards 8 and 9. The individual elements are electrically series-connected, via crossed-over wires 6'. The boards 8 and 9 serve to improve thermal coupling and can optionally also be omitted. They are preferably formed as good heat conductors and, to prevent electric short-circuits, are preferably constructed from ceramic, electrically non-conductive materials (e.g. $Al_2O_3$).

Figure 14:
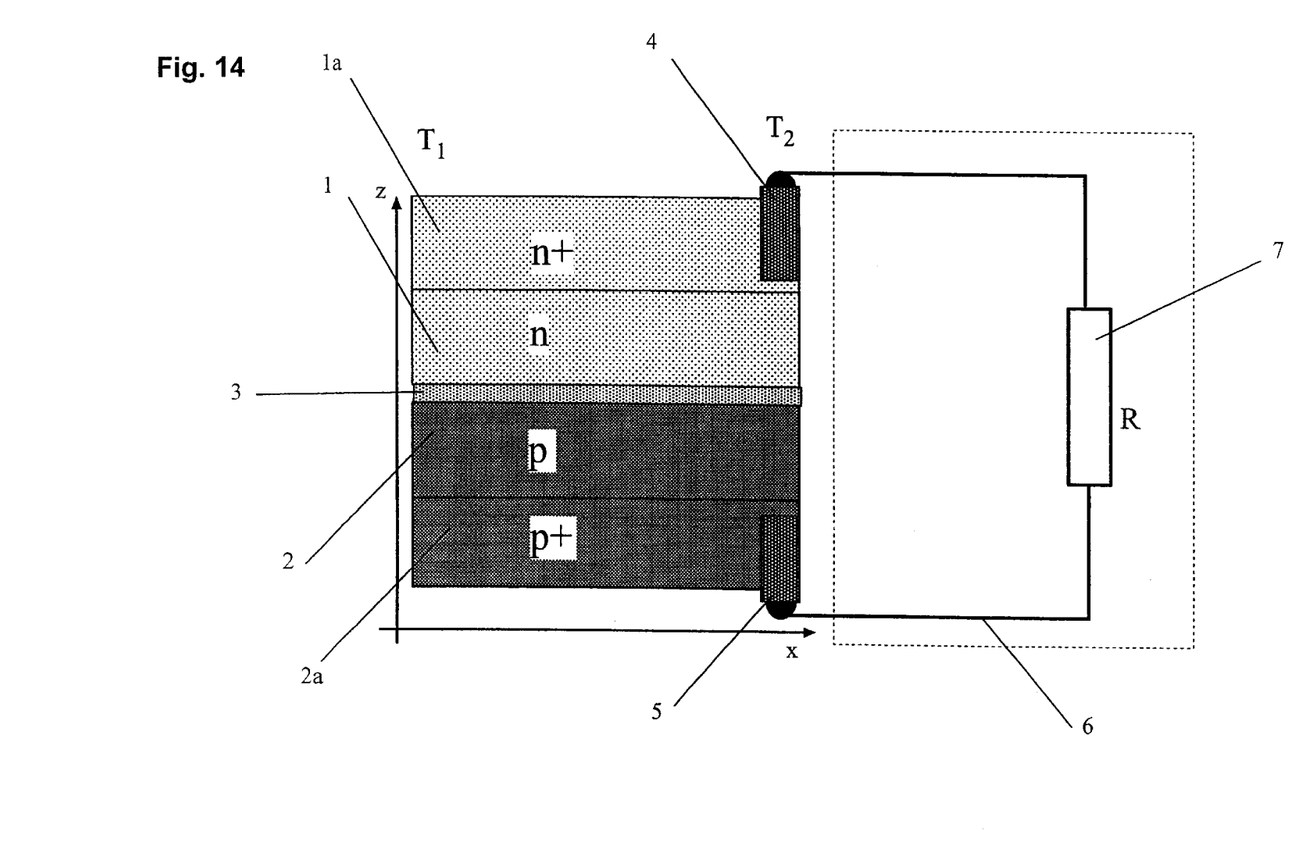
FIG. 14 is a view of an embodiment with a highly doped n-, an n-, an p- and a highly doped p-layer.

To improve the degree of efficiency of the thermoelectric element consisting of two layers 1,2 (n- and p-doped), and of the pn-junction formed between these, it is possible, as represented in FIG. 14, to add two further layers, 1a, 2a. To the existing n-layer 1, a highly doped n-layer 1a is added, and to the p-layer 2, a highly doped p-layer 2a is added so that the following layer structure with 4 layers is obtained: $n^+$- n - p - $p^+$. The selective contacting remains identical to that in the case of two layers.

There are three areas in particular, in which the invention can be applied. Firstly, it can be applied to thermoelectric generators for the direct conversion of a temperature difference into current. With this concept, any residual heat accruing, which would otherwise remain unused, can be utilized. Secondly, it can be used to take advantage of the reverse effect to generation: due to a flow of current, one end becomes hot and the other cold. This effect can be used for active cooling (to achieve low temperatures, or to eliminate heat). Thirdly, it can be used to strengthened heat conductivity, which can serve for efficient passive cooling, such as in air-conditioning plants or for (power-) electronics.

What is claimed is:

1. A thermoelectric element comprising:
   at least one doped semiconductor including at least one n-layer and at least one p-layer selectively electrically contacted, said at least one n-layer and said at least one p-layer being arranged so that at least one pn-junction is formed along a boundary between said at least one n-layer and said at least one p-layer extending along substantially a total extent of said at least one n-layer and said at least one p-layer, and so that a temperature gradient is formed along said pn-junction parallel to said boundary between said at least one n-layer and said at least one p-layer.

2. The thermoelectric element of claim 1, wherein said pn-junction is formed along a longest surface of said at least one n-layer and said at least one p-layer.

3. The thermoelectric element of claim 1, wherein said at least one n-layer and said at least one p-layer are selectively electrically contacted by a plurality of electrical contacts including at least one contact directly contacting at least one of said at least one n-layer and said at least one p-layer.

4. The thermoelectric element of claim 1, wherein said at least one n-layer and said at least one p-layer are selectively electrically contacted by a plurality of electrical contacts including at least one alloyed contact.

5. The thermoelectric element of claim 1, wherein at least one physical parameter of said thermoelectric element varies in a direction parallel to the boundary layer.

6. The thermoelectric element of claim 5, wherein said at least one physical parameter comprises at least one of a material composition, a doping, a layer thickness, and a layer width.

7. The thermoelectric element of claim 1, wherein said temperature gradient is flatter at a hot end of said thermoelectric element than at a cold end of said thermoelectric element.

8. The thermoelectric element of claim 7, wherein a material at said hot end has a higher heat conductivity than a material at said cold end.

9. The thermoelectric element of claim 7, wherein a width of said thermoelectric element measured across a direction of said temperature gradient and parallel to said boundary between said at least one n-layer and said at least one p-layer decreases sharply towards said cold end.

10. The thermoelectric element of claim 9, wherein said width of said thermoelectric element measured across said direction of said temperature gradient and parallel to said boundary between said at least one n-layer and said at least one p-layer decreases sharply just before said cold end.

11. The thermoelectric element of claim 1, wherein said at least one n-layer and said at least one p-layer are selectively electrically contacted at a cold end of said thermoelectric element.

12. The thermoelectric element of claim 1, wherein said at least one doped semiconductor comprise compound semiconductors.

13. The thermoelectric element of claim 12, wherein said compound semiconductors are $Bi_2Te_3$, $PbTe$, $SiGe$.

14. The thermoelectric element of claim 1, wherein said at least one doped semiconductor comprises one of a ternary compound and a quaternary compound.

15. The thermoelectric element of claim 1, wherein each of said at least one doped semiconductor has a high doping value of at least $10^{18}$ $cm^{-3}$.

16. The thermoelectric element of claim 1, wherein said at least one doped semiconductor includes at least two pn-junctions formed by sequentially alternating n-layers and p-layers.

17. A thermoelectric apparatus comprising:
    at least two thermally parallel and electrically series-connected thermoelectric elements, each thermoelectric element including:
    at least one doped semiconductor including at least one n-layer and at least one p-layer selectively electrically contacted, said at least one n-layer and said at least one p-layer being arranged so that at least one pn-junction is formed along a boundary between said at least one n-layer and said at least one p-layer extending along substantially a total extent of said at least one n-layer and said at least one p-layer, and so that a temperature gradient is formed along said pn-junction parallel to said boundary between said at least one n-layer and said at least one p-layer.

18. The thermoelectric element of claim 17, wherein said thermoelectric elements are thermally inter-connected at a cold end and at a hot end, respectively, via a heat conductor.

19. The thermoelectric element of claim 18, wherein said heat conductor is a ceramic head conductor.

20. The thermoelectric element of claim 18, wherein said thermoelectric elements are attached to said heat conductor at said cold end and at said hot end, respectively.

21. A method of using the thermoelectric element of claim 1 as a thermoelectric generator to convert a temperature difference into current.

22. A method of using the thermoelectric element of claim 1 as a cooling element, wherein a first end of said thermoelectric element is heated and second end of said thermoelectric element opposite said first end cools due to an established flow of current.

* * * * *